(12) United States Patent
Barford et al.

(10) Patent No.: US 8,005,633 B2
(45) Date of Patent: Aug. 23, 2011

(54) EXCITATION SIGNAL GENERATOR FOR IMPROVED ACCURACY OF MODEL-BASED TESTING

(75) Inventors: Lee Alton Barford, San Jose, CA (US); Nicholas Tufillaro, San Francisco, CA (US); Ajay Khoche, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 338 days.

(21) Appl. No.: 11/347,888

(22) Filed: Feb. 6, 2006

(65) Prior Publication Data

US 2007/0185671 A1    Aug. 9, 2007

(51) Int. Cl.
  *G01R 23/16*  (2006.01)
(52) U.S. Cl. ........................................... 702/76
(58) Field of Classification Search .............. 702/76, 702/111, 117, 189
See application file for complete search history.

(56) References Cited

U.S. PATENT DOCUMENTS

| | | | | |
|---|---|---|---|---|
| 6,029,090 A * | 2/2000 | Herbst | ............................ | 607/66 |
| 6,593,013 B2 | 7/2003 | Nii | ............................... | 428/690 |
| 6,775,646 B1 | 8/2004 | Tufillaro | ........................... | 703/2 |
| 6,804,317 B2 | 10/2004 | Olsen | ............................. | 375/368 |
| 6,850,871 B1 * | 2/2005 | Barford et al. | .................... | 703/2 |
| 6,964,551 B1 | 11/2005 | Friesen | .............................. | 414/523 |
| 7,110,266 B1 | 9/2006 | Porter | ............................. | 363/21 |
| 2004/0052314 A1 * | 3/2004 | Copeland | ........................ | 375/296 |

OTHER PUBLICATIONS

Rick Pintelon and Johan Schoukens, System Identification, A Frequency Domain Approach, IEEE Press 2001 Piscataway, NJ.
K. Vanjoenacker, J. Schoukens, J. Swevers, and D. Vaes, Summary and comparing overview of techniques for the detection of the non-linear distortions.
J. Schoukens and R. Pintelon, Design of optimal excitation signals, Multifrequency Testing for System Identification, IEE Colloquium on Jun. 8, 1990 pp. 3/1-3/3.
P. Guillaume, J. Schoukens, R. Pintelon, and I. Kollar, Crest-Factor Minimization Using Nonlinear Chebyshev Approximation Methods, IEEE Transactions on Instrumentation and Measurement, vol. 40. No. 6, Dec. 1991 pp. 982-9893.

* cited by examiner

*Primary Examiner* — Bryan Bui
(74) *Attorney, Agent, or Firm* — Holland & Hart, LLP

(57) ABSTRACT

An excitation signal generator ("ESG") is described. The ESG generates an minimized excitation signal for use in a test system to generate a functional model of a device under test ("DUT") where extreme values of the minimized excitation signal are increased toward a central value without changing the power spectrum at the DUT.

20 Claims, 6 Drawing Sheets

EXCITATION SIGNAL GENERATOR FOR IMPROVED ACCURACY OF MODEL-BASED TESTING

BACKGROUND OF THE INVENTION

It is often necessary to test an electrical device commonly referred to as a device under test ("DUT") in order to identify faults, verify performance, and determine characteristics of the DUT. In electrical systems, numerous test devices and circuits may be connected together to form a system under test ("SUT") that includes a DUT. In order to test the SUT, these test devices and circuits are calibrated and functional models are created for the DUT using linear signals and inputs. But, the approach of using linear signals and inputs for testing and functional modeling often does not compensate or take into consideration the non-linear input that the DUT may typically experience when used in the real world.

In another approach to calibrating test devices and modeling DUTs for model-based tests, the DUT is excited with white, zero-mean noise that is band-limited to the frequency range of interest. The white, zero-mean noise is then scaled so that the maximum and minimum values of the signal correspond to the maximum and minimum output of the excitation of the digital-to-analog converters or arbitrary waveform generator. The response of the SUT is then measured enabling a functional model of the DUT. This functional model of the DUT may then be used for performance model-based testing as discussed in U.S. Pat. No. 6,850,871, titled "Extraction of Nonlinear Black Box Behavioral Models from Embeddings of Time-Domain Measurements," and U.S. Pat. No. 6,775, 646, titled "Excitation Design and Model Structure for Data Driven Models of Electronic System."

A problem that exists with the previous approaches to performance model-based testing is that they have Fourier components in their signals and the signals will generally not have an integer number of cycles within the time window of the excitation signal. This reduces model extraction accuracy and is the result of transformations, such as leakage that occurs when the input and output signals are Fourier transformed.

In yet another approach to performance model-based testing, a modulated signal similar to a normal operation signal is applied to the DUT. This signal is typically random so that the DUT is excited over the entire normal frequency and instantaneous power range of normal operation. This is an improvement over linear excitation or white noise excitation, but is impractical for CDMA type modulated signals. CDMA type modulation consists of a pseudo-random sequence that is mixed and filtered. This is a random signal with components in the power spectral density at all frequencies and hence the leakage cannot be systematically controlled.

Furthermore, normal modulation signals used in the CDMA protocol, such as the 5 Mhz channel signal, covers only a limited bandwidth. A typical normal CDMA operation signal covers a 5 Mhz channel and requires multiple experiments to cover the wideband frequency response of the devices since typical performance metrics are measured from signals outside of the CDMA information channel. For example, a 100 Mhz frequency band may be required to test the out-of-channel harmonic response (e.g. IP2, IP3 and higher order nonlinear harmonic responses) and this 100 Mhz frequency band requires additional tests (in this example, at least 20 additional tests).

Therefore, there is a need for an approach to provide a SUT with an excitation signal for model-based testing, that results in a model with substantially less model bias, where model bias results in less accurate predictions of test metrics.

SUMMARY

An excitation signal generator ("ESG") with an input for receipt of an input signal is described, where the ESG is configured to generate a minimized excitation signal with an associated power spectrum. The ESG may include a second input configured to receive a frequency range associated with a system under test ("SUT") and a controller in signal communication with the input and second input. The controller may be configured to determine the frequency range of the SUT, identify a number of frequency lines to be in a minimized excitation signal, compute a set of frequency lines based on the frequency range of the SUT and the number of frequency lines, identify a minimum amplitude of a frequency line in the set of frequency lines, and generate the minimum excitation signal having extreme values in response to receipt of the input signal. In order to generate the minimum excitation signal, the controller may be configured to generate the minimized excitation signal having the extreme values using the number of frequency lines, frequency range of the SUT, and minimum amplitude, wherein the extreme values of the minimized excitation signal are increased toward a central value without affecting the power spectrum of the minimized excitation signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

An excitation signal generator ("ESG") is described. The ESG generates an minimized excitation signal for use in a test system to generate a functional model of a device under test ("DUT") where extreme values of the minimized excitation signal are increased toward a central value without changing the power spectrum at the DUT.

Figure 1:
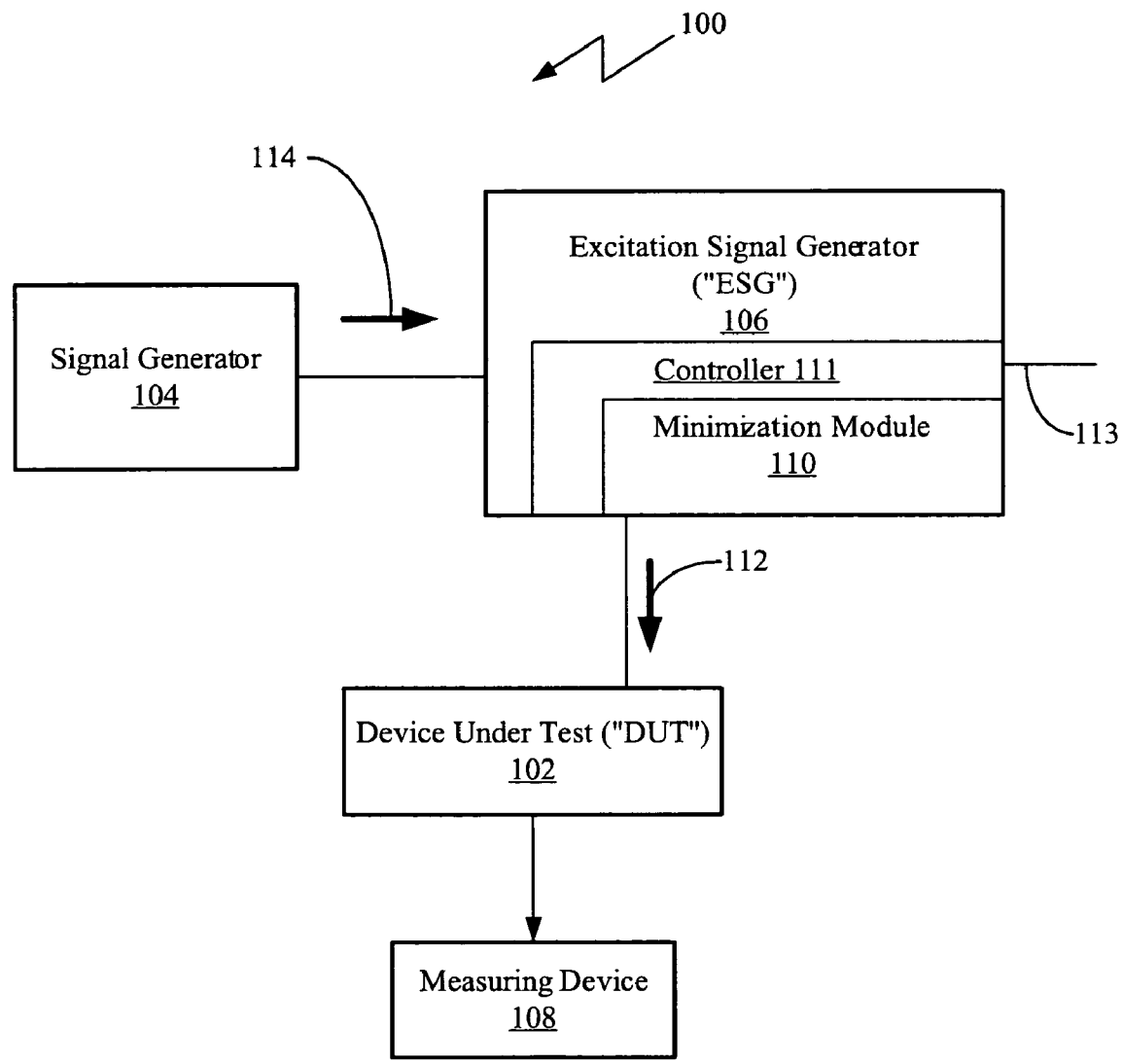
FIG. 1 shows a block diagram of an example of an implementation of a system under test ("SUT") that is connected to a device under test ("DUT") that receives an excitation signal from an excitation signal generator.

In FIG. 1, a block diagram of an example of an implementation of a system under test ("SUT") 100 is shown. The SUT 100 may include a DUT 102, signal generator 104, ESG 106, and measuring device 108. The ESG 106 may include a minimization module 110.

In an example of operation, the ESG 106 produces an excitation signal 112 that is input into the DUT 102. If the ESG 106 receives an initial signal (initial excitation signal) 114 from the signal generator 104 at an input. The ESG 106 may then apply a minimization procedure to the received signal 104 with the minimization module 110 controlled by controller 111, where the minimization module 110 may perform the minimization procedure utilizing, for example, a crest factor minimization algorithm. The controller 111, may be a digital signal processor, microprocessor, digital logic configured to function as a state machine, analog circuit configured to work as a state machine, or a combination of analog and digital circuits to function as a controller. The controller 111 may also be able to receive data from users via a second input 113. This second input may be via a keyboard, keypad, test script, and one or more data files, to name but a few examples.

The minimization module 110 then modifies the minimized excitation signal such that the extreme values of the minimized excitation signal 112 are increased toward a central value without changing the power spectrum of the minimized excitation signal 112. The minimized excitation signal 112 is then injected into the DUT 102. The results are then measured by the measuring device 108, which produces a more accurate functional model of the signal response of the DUT 102.

Examples of the signal generator 104 may include digital-to-analog converters ("ADC"), arbitrary waveform generators, direct digital synthesizers, and combinations of any of those with mixers, oscillators, filters, and other components that convert signals to frequency regions far from baseband. Examples of the DUT 102 may include, but is not limited to, analog or digital radio transmitter or receivers (used in products such as cell phones, wireless network devices, television or video devices) or their components, instrumentation front ends, and examples of a measuring device 108 may include analog-to-digital converters, data acquisition cards, oscilloscopes, spectrum analyzers, or network analyzers. In the current implementation example, the signal generator 104 is shown separate from the ESG 106, but in other implementations the signal generator 104 may be incorporated in the ESG 106. Further, the measuring device 108 may also be incorporated into the ESG 106.

The minimized excitation signal 112 from the ESG 106 may have frequency components that have an integer number of cycles during the time duration of the minimized excitation signal 112. By having an integer number of cycles, frequency leakage at the SUT 100 is reduced. Reduction of the frequency leakage is achieved at the output rather than elimination of the frequency leakage at the output, because the frequency leakage may occur as the result of nonlinear affects of the output power at frequency lines other than those in the minimized excitation signal 112.

The extreme values (highest and lowest amplitudes of the frequencies of the bandwidth) of the minimized excitation signal 112 are increased toward a central value (e.g., an amplitude value selected by a user) without changing the power spectrum at the DUT 102 as the result of the minimization module 110. This increase of the extreme values toward the center value is known as "crest factor minimization." As an example, the minimization module 110 utilizing a crest factor minimization algorithm presents the DUT 102 with a sudden large amplitude signal that forces devices, such as amplifiers, in the DUT 102 into compression. Excitation signals without crest factor normalization typically result in highly biased models. With the crest factor minimization algorithm, the DUT 102 is presented with a distributed range of amplitudes and velocities, which lead to functional models that are more accurate and less biased.

Formulas are derived that allow the minimized excitation signal 112 to be specified by design parameters, such as number of excitation lines, center frequency of lines, bandwidth to be covered by the model, to name but a few design parameters. Using the derived formula, a specification for the minimized excitation signal 112 may then be generated that insures a minimized excitation signal 112 with minimal spectral leakage. Minimal spectral leakage is desirable because minimizing spectral leakage makes it easier to correctly identify non-linear behaviors of the DUT 102, because the power of the minimized excitation signal 112 may then be designed to be limited to a small number (say in the hundreds) of spectral lines. Energy at the output(s) of the DUT 102 at other frequencies may be indicative of the non-linear behavior of the DUT 102.

Figure 2:
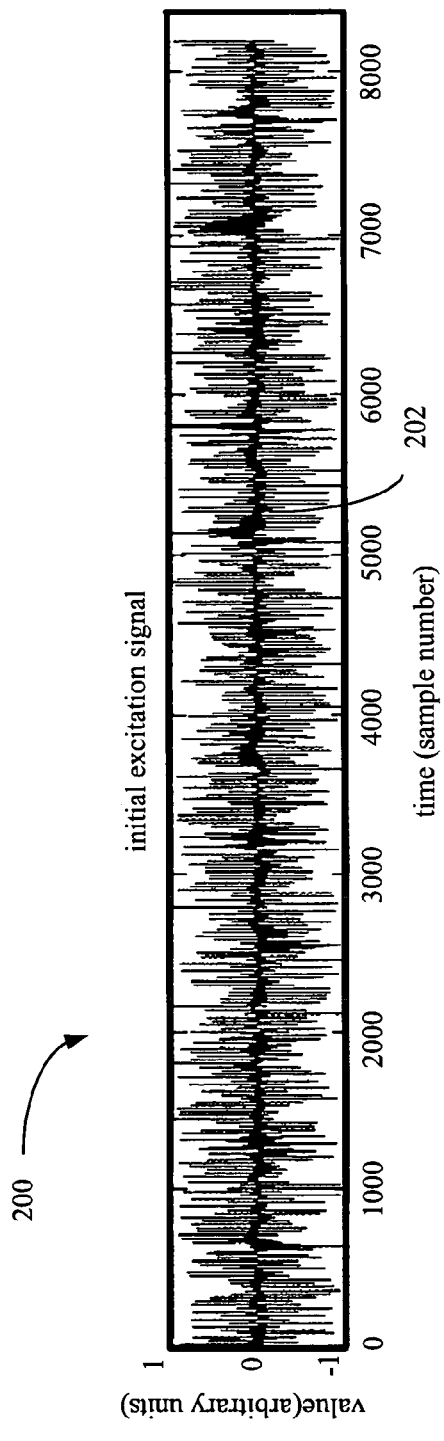
FIG. 2 shows a graph that shows an initial excitation signal from the excitation signal generator that is injected into the system under test of FIG. 1.

One example approach for generating a minimized excitation signal 112 has a particular amount of power on particular or predetermined spectral lines; this may be accomplished by choosing a random phase for each spectral line and then using an inverse Fourier transform algorithm (for example, the Inverse Fast Fourier Transform ("IFFT") algorithm) to convert the powers and phases into time-domain samples. Turning to FIG. 2, a graph 200 shows an initial excitation signal 202 that is generated by the ESG 106 using the random phase approach in the SUT 100 of FIG. 1. The frequency range of the excitation signal may be determined by the maximum frequency and minimum frequency that the DUT 102 was designed to operate. The approximate signal-to-noise ("SIN") ratio of the measurement device 108 may be used as an amplitude ratio in a linear scale (called "S"). For example, if S/N ratio of the measurement apparatus is 100 db, then amplitude ratio in the linear scale is $S=1e^5$.

The number of frequency lines to be used in the initial excitation signal 202 may then be selected. The number of frequency lines is selected so that the final FET is of size $2^n$, where "n" is sufficiently large to allow a smooth interpolation of the frequency response function ("FRF") of the DVT in the frequency range considered. The minimum amplitude for a frequency line is determined by the formula; $A_{min} = 1/(S/A_{ratio})$, where $A_{ratio}$ is a number much greater than one based on the tradeoff between convergence time and amount of power for non-desired frequencies as desired by the user. In the current example, if $A_{ratio}$ is equal to 100, there is an acceptable tradeoff between convergence time for the crest factor minimization algorithm (also referred to as "peak factor" of a signal) and the amount of excitation power devoted to non-desired frequencies.

The amplitude spectrum for the initial excitation signal 202, A(f), the amplitude of frequency "f" in the set of frequency lines "F", may be represented by:

A(f)=1, if f is in $[f_{min}, f_{max}]$;

Otherwise $A(f)=A_{min}$.

In the current example, the initial excitation signal 202 is shown in arbitrary units, as the initial excitation signal 202 may be scaled and shifted as needed to conform to the range of the ESG to be used. In the current example, the initial excitation signal 202 is centered about the zero signal level over 8000 samples for a period of 100 MHz sample rate. The sample rate of 100 MHz is chosen for this example because it is at the high end of current data conversion capabilities, but in the future it is foreseeable that higher sample rates may be selected.

Figure 3:
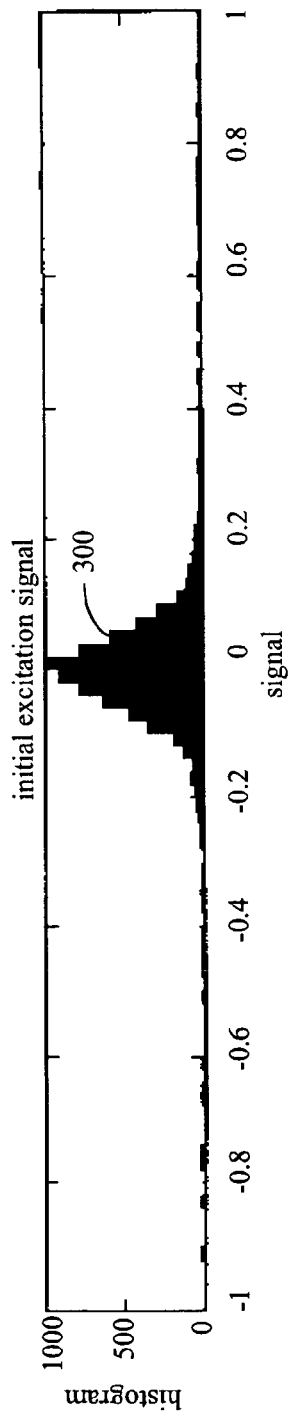
FIG. 3 shows a histogram of the initial excitation signal from the excitation signal generator that was injected into the SUT of FIG. 1.

In FIG. 3, a histogram 300 of the initial excitation signal 202, FIG. 2, which was injected into the DUT 102, FIG. 1, is shown. As shown by the histogram 300, most of time, the value of the initial excitation signal 202 is centered about zero.

Figure 4:
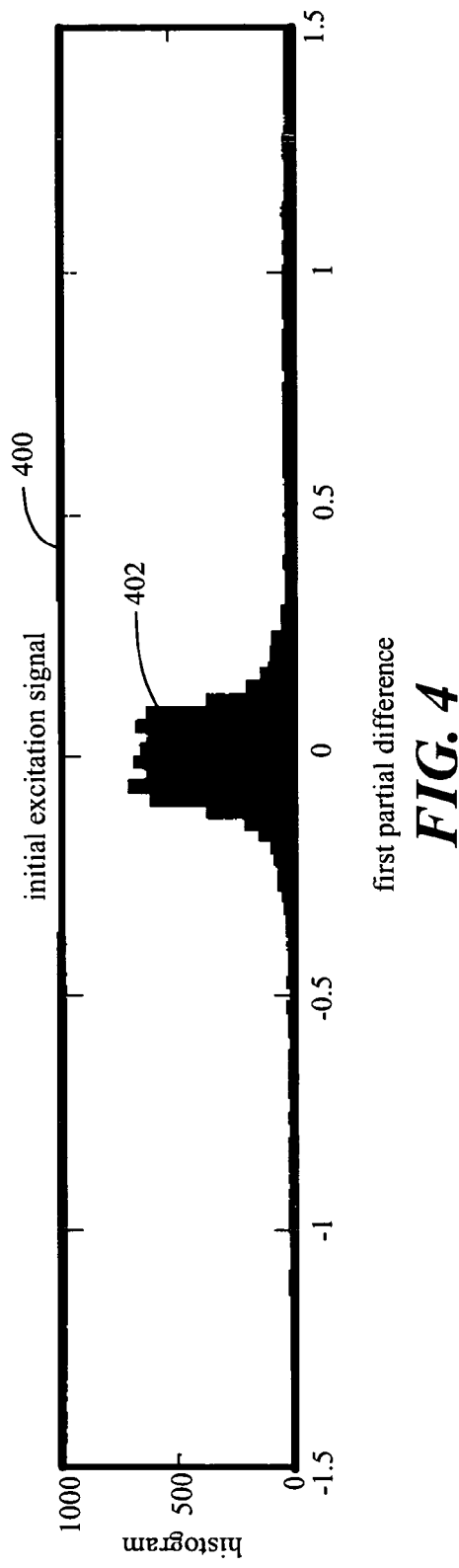
FIG. 4 shows a histogram of the first partial difference of the initial excitation signal from the excitation signal generator that was injected into the SUT of FIG. 1.
Figure 5:
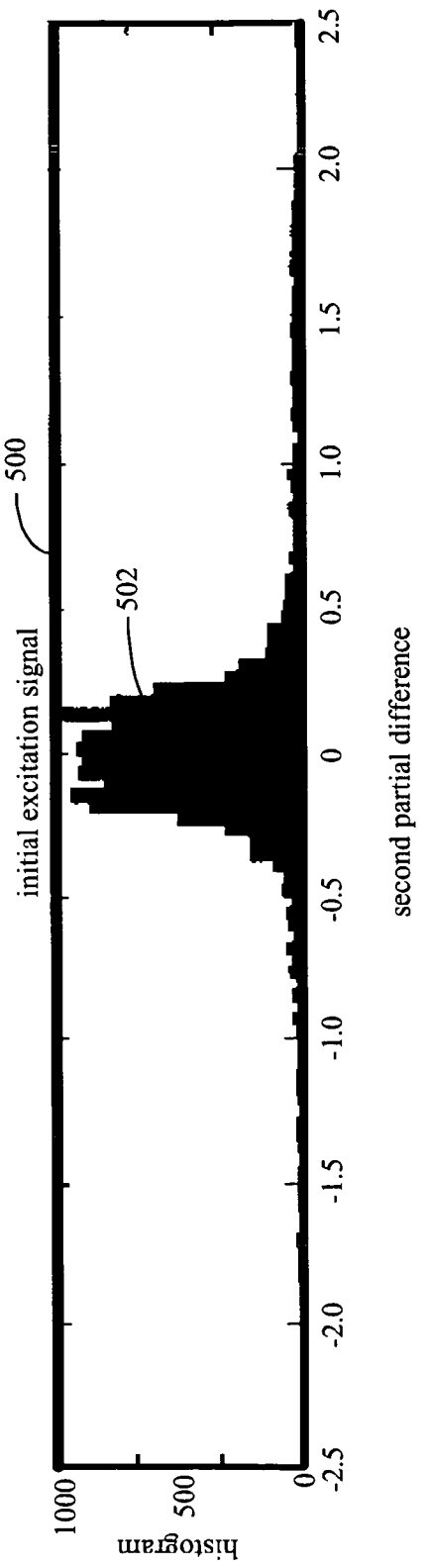
FIG. 5 shows a histogram of the second partial difference of the initial excitation signal from the excitation signal generator that was injected into the SUT of FIG. 1.

Turning to FIG. 4 and FIG. 5, histograms 400 and 500 of the first partial difference 402 and the second partial difference 502 of the initial excitation signal 202, FIG. 2, which was injected into the DUT 102 of FIG. 1 is shown. The first partial difference 402 may also be referred to as the velocity of the initial excitation signal 202. A model based on the initial excitation signal 202 of FIG. 2, is biased toward a signal with small amplitude and low velocities as shown by the histogram 400 and 500 and fails to adequately expose the nonlinear distortions products of the DUT 102 of FIG. 1.

Figure 6:
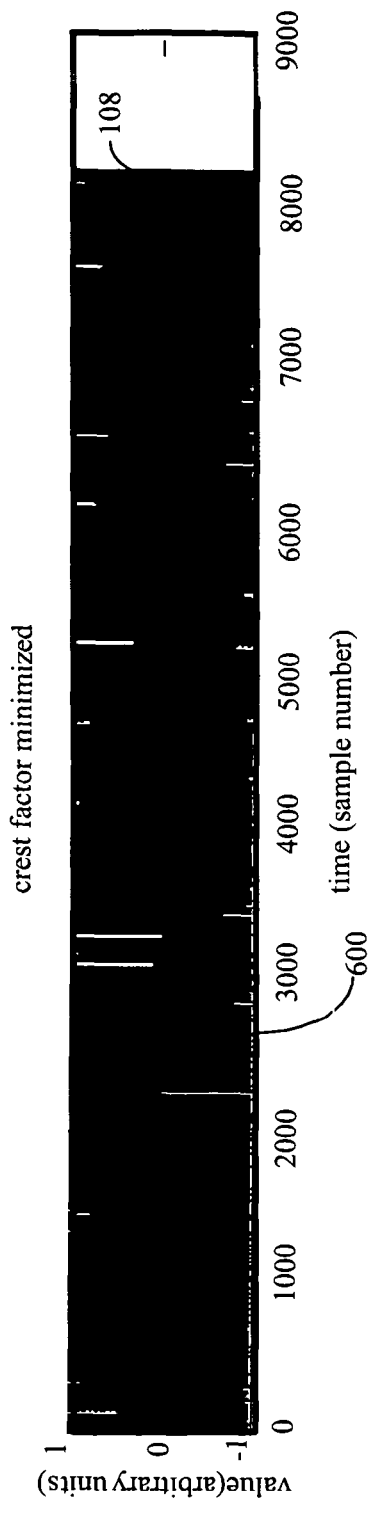
FIG. 6 shows a graph of a minimized excitation signal of FIG. 1 after the minimization module has been applied.

Turning to FIG. 6, a graph 600 of minimized excitation signal 112 of FIG. 1 after the minimization module 110 has applied crest factor minimization is shown. Examples of crest factor minimization algorithms are described in *System Identification, A Frequency Domain Approach*, Rik Pintelon and John Schoukens, IEEE Press 2001, and *Crest-Factor Minimization Using Nonlinear Chebyshev Approximation Methods*, Patrick Guillaume, Johan Schoukens, Rik Pintelton, and Istvan Kollar, IEEE Transactions on Instrumentation and Measurement, Vol. 40, No. 6, December 1991, which are incorporated by reference in their entirety.

Figure 7:
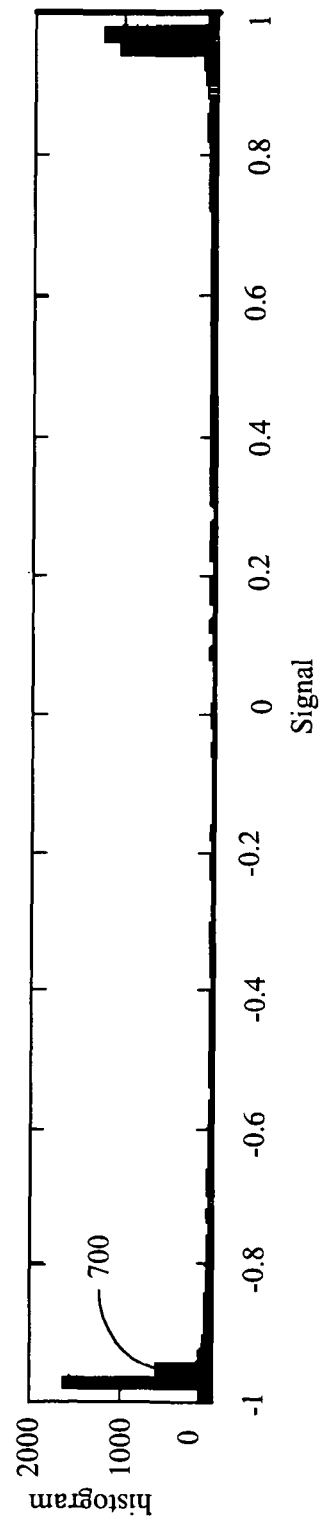
FIG. 7 shows a histogram of the crest factor minimization of FIG. 6.
Figure 8:
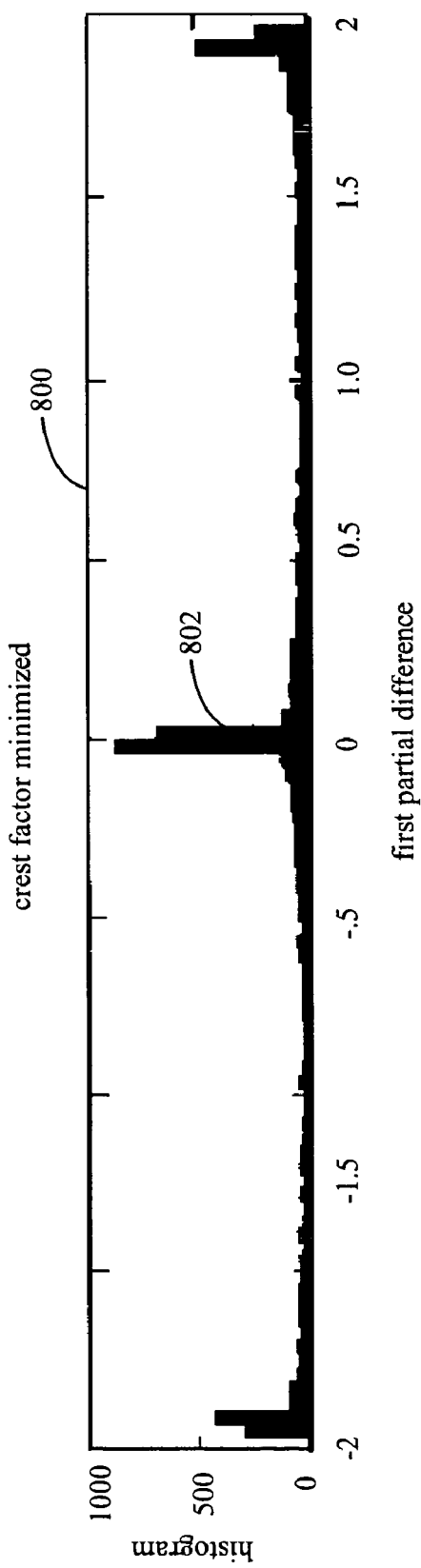
FIG. 8 shows a histogram of the first partial difference of the crest factor minimization of FIG. 6.
Figure 9:
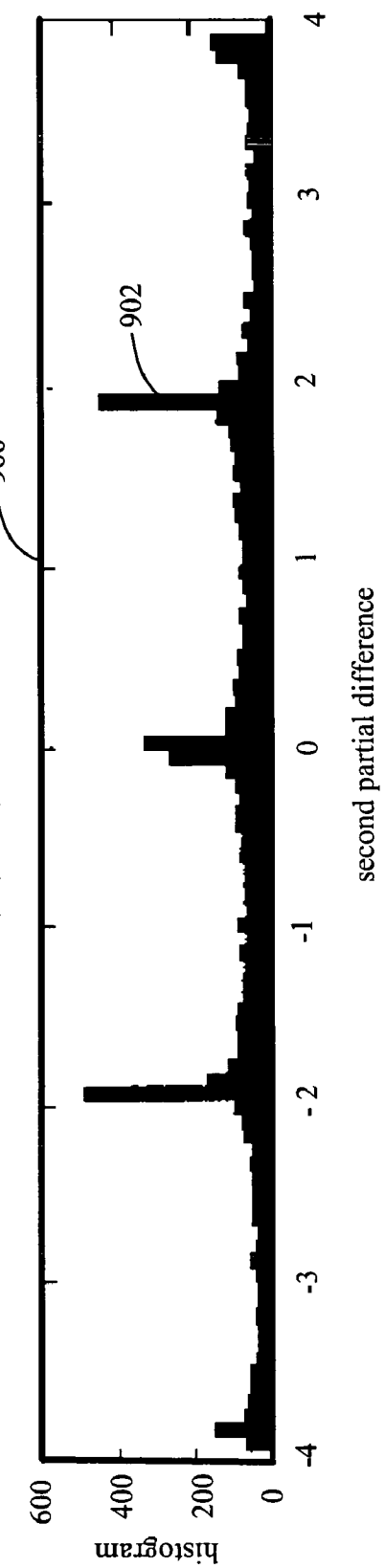
FIG. 9 shows a histogram of the second partial difference of the crest factor minimization of FIG. 6.

In FIG. 7, a histogram 700 of the minimized excitation signal 112, FIG. 1, after crest factor minimization of FIG. 6 is shown. As seen in the histogram 700, the signal amplitudes are spread out across the excitation range. Furthermore, in FIG. 8, a histogram 800 of the first partial difference 802 of the crest factor minimization of FIG. 6 shows the velocities are also spread across the excitation range. Moreover, the histogram 800 of the first partial difference is approaching the appearance of a first partial difference histogram of a sine wave. Similarly, in FIG. 9, a histogram 900 of the second partial difference 902 of the crest factor minimization of FIG. 6 is spread across the excitation range and shows that a better training result is achieved for estimating a model that captures both the linear response of the DUT (frequency response function) as well as the nonlinear response (as a measured by its distortion products).

Figure 10:
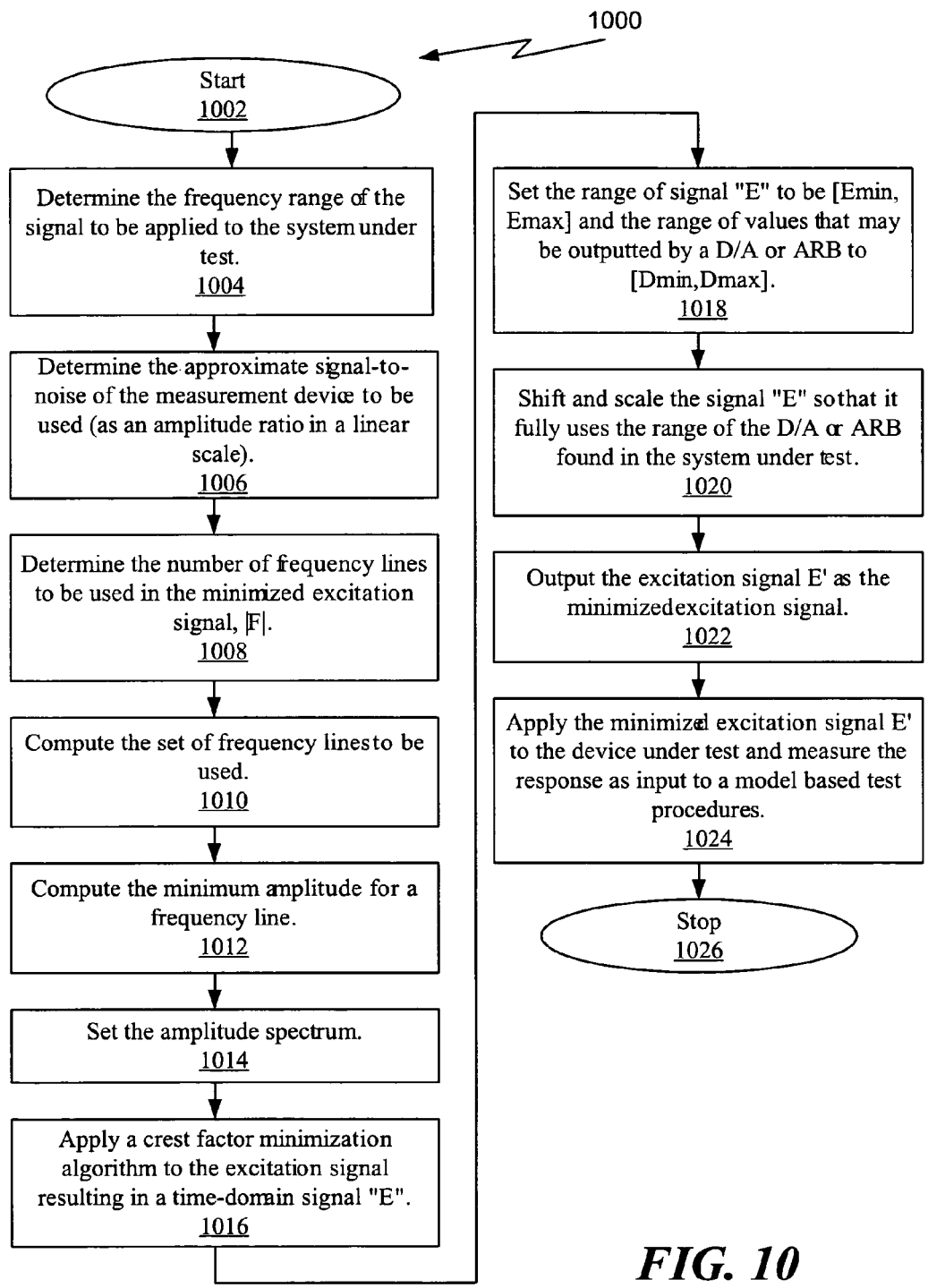
FIG. 10 shows a flow diagram of modeling of the response of the SUT of FIG. 1 with a minimized excitation signal.

FIG. 10 is a flow diagram 1000 of modeling the response of the SUT 100 of FIG. 1 using a minimized excitation signal. The flow diagram 1000 starts at step 1002 by determining the frequency range $f_{min}$ and $f_{max}$, in step 1004, for the signal 114 generated by the signal generator 104. In step 1006 the approximate signal-to-nose ratio, expressed as an amplitude ratio in a linear scale of the measuring device 108, is determined. In the current example, the signal to noise power ratio may be 100 db, and the amplitude ratio in a linear scale is expressed as $S=1e^5$. This determination may be made by measuring the signal-to-noise ratio of the measuring device 108, or by using a value contained in documentation associated with the measuring device 108.

The number of frequency lines "F" to be used in the minimized excitation signal 112 is selected so that the final FFT has a size of $2^n$, where n is sufficiently large to allow a smooth interpolation of the FRF of the DUT in the desired frequency range is then determined in step 1008. In step 1012, the minimum amplitude for the frequency lines is then derived with $$A_{min} = \frac{1}{\left(\frac{S}{A_{ratio}}\right)}$$

where $A_{ratio}$ is a number much greater than one, $A_{ratio}$ such as 100. As an example, $A_{ratio}=100$ may be chosen because it results in an acceptable tradeoff between convergence time for the crest factor minimization algorithm and the amount of excitation power devoted to uninteresting frequencies.

The amplitude spectrum for the excitation signal A(f) is then set in step 1014, where:

If f is in $[f_{min}, f_{max}]$, than A(f)=1

Otherwise, A(f)=$A_{min}$.

The amplitude spectrum A(f) is then passed to the minimization module 110 in the ESG 106 in step 1016. The minimization module 110 utilizes a crest factor minimization algorithm that results in a signal that is a time-domain signal "E".

The range of the signal "E" is then set to be $[E_{min}, E_{max}]$ and the range of values $[D_{min}, D_{max}]$ that may be outputted by a digital-to-analog ("D/A") converter, or an arbitrary waveform generator ("ARB"), to is set to $[D_{min}, D_{max}]$ in step 1018; In step 1020, the excitation signal E is shifted and scaled so that it fully uses the range of the D/A or ARB, i.e $[D_{min}, D_{max}]$ resulting in the excitation signal E'. The excitation signal E' is then outputted in step 1022 as excitation signal 112 and applied to the DUT 102 in step 1024 for use in deriving the model of the DUT 102. Processing is then shown as completing in step 1026. In other implementation examples, processing may optionally loop back to start step 1002.

It is appreciated by those skilled in the art that the flow diagram shown in FIG. 10 may selectively be implemented in hardware, software, or a combination of hardware and software. An embodiment of the process steps may employ at least one machine-readable signal bearing medium. Examples of machine-readable signal bearing mediums include computer-readable mediums such as a magnetic storage medium (i.e. floppy disks, or optical storage such as compact disk ("CD") or digital video disk ("DVD")), a biological storage medium, or an atomic storage medium, a discrete logic circuit(s) having logic gates for implementing logic functions upon data signals, an application specific integrated circuit having appropriate logic gates, a programmable gate array(s) ("PGA"), a field programmable gate array ("FPGA"), a random access memory device ("RAM"), read only memory device ("ROM"), electronic programmable random access memory ("EPROM"), or equivalent. Note that the computer-readable medium could even be paper or another suitable medium, upon which the computer instruction is printed, as the program can be electronically captured, via for instance optical scanning of the paper or other medium, then compiled, interpreted or otherwise processed in a suitable manner if necessary, and then stored in a computer memory.

Additionally, machine-readable signal bearing medium includes computer-readable signal bearing mediums. Computer-readable signal bearing mediums have a modulated carrier signal transmitted over one or more wire based, wireless or fiber optic networks or within a system. For example, one or more wire based, wireless or fiber optic network, such as the telephone network, a local area network, the Internet, or a wireless network having a component of a computer-readable signal residing or passing through the network. The computer readable signal is a representation of one or more machine instructions written in or implemented with any number of programming languages.

Furthermore, the multiple process steps implemented with a programming language, which comprises an ordered listing of executable instructions for implementing logical functions, can be embodied in any machine-readable signal bearing medium for use by or in connection with an instruction execution system, apparatus, or device, such as a computer-based system, controller-containing system having a processor or controller, such as a microprocessor, digital signal processor, discrete logic circuit functioning as a controller, or other system that can fetch the instructions from the instruction execution system, apparatus, or device and execute the instructions.

The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. A method for generation of a minimized excitation signal with an associated power spectrum, the method comprising:
   determining a frequency range of a system under test ("SUT");
   identifying a number of frequency lines to be in the minimized excitation signal;
   computing a set of frequency lines based on the frequency range of the SUT and the number of frequency lines;
   identifying a minimum amplitude of a frequency line in the set of frequency lines; and
   generating the minimized excitation signal having extreme values in response to receipt of an input signal, wherein generating the minimized excitation signal includes
      generating the minimized excitation signal having the extreme values using the number of frequency lines, frequency range of the SUT and the minimum amplitude; and
      utilizing crest factor minimization to increase the extreme values of the minimized excitation signal toward a central value, without affecting the power spectrum of the minimized excitation signal.

2. The method of claim 1, wherein generating the minimized excitation signal further includes shifting the minimized excitation signal so that the minimized excitation signal uses a full signal range of a device under test ("DUT") in the SUT.

3. The method of claim 2, wherein generating the minimized excitation signal further includes scaling the minimized excitation signal so that the minimized excitation signal uses a fill signal range of the DUT.

4. The method of claim 1, wherein generating the minimized excitation signal further includes scaling the minimized excitation signal so that the minimized excitation signal uses a full signal range of a device under test ("DUT") in the SUT.

5. The method of claim 4, wherein the DUT is an amplifier.

6. The method of claim 1, further includes generating the input signal with a signal generator from which the minimized excitation signal is generated.

7. The method of claim 6, wherein generating the input signal and the minimized excitation signal occurs within a single device within the SUT.

8. An excitation signal generator ("ESG") with an input for receipt of an input signal, wherein the ESG is configured to generate a minimized excitation signal with an associated power spectrum, the ESG comprising:
   a second input configured to receive a frequency range associated with a system under test ("SUT"); and
   a controller in signal communication with the input and second input, the controller configured to
      determine the frequency range of the SUT,
      identify a number of frequency lines to be in a minimized excitation signal;
      compute a set of frequency lines based on the frequency range of the SUT and the number of frequency lines;
      identify a minimum amplitude of a frequency line in the set of frequency lines, and
      generate the minimum excitation signal having extreme values in response to receipt of the input signal, wherein configured to generate minimum excitation signal includes
      the minimized excitation signal having the extreme values using the number of frequency lines, frequency range of the SUT, and minimum amplitude; and
      utilizing crest factor minimization to increase the extreme values of the minimized excitation signal toward a central value, without affecting the power spectrum of the minimized excitation signal.

9. The ESG of claim 8, wherein the controller is further configured to shift the input signal such that the minimize excitation signal uses a full signal range of a device under test ("DUT") in the SUT.

10. The ESG of claim 9, wherein the controller is fiber configured to scale the input signal so that the minimized excitation signal uses the full signal range of the DUT in the SUT.

11. The ESG of claim 8, wherein the controller is further configured to scale the input signal so that the minimized excitation signal uses a full signal range of a device under test ("DUT") in the SUT.

12. The ESG of claim wherein the OUT is an amplifier.

13. The ESG of claim 8, further includes a signal generator that is configured to generate the input signal that is input into the ESG.

14. The ESG of claim 13, wherein the ESG is a single device.

15. A non-transitory computer readable media having computer instructions stored thereon for causing a computer processor to generate a minimized excitation signal with an associated power spectrum, the computer readable media comprising:
   a first set of instructions for determining a frequency range of a system under test ("SUT");
   a second set of instructions for identifying a number of frequency lines to be in the minimized excitation signal;
   a third set of instructions for computing a set of frequency lines based on the frequency range of the SUT and the number of frequency lines;
   a fourth set of instructions for identifying a minimum amplitude of a frequency line in the set of frequency lines; and
   a fifth set of instructions for generating the minimized excitation signal having extreme values in response to receipt of an input signal, wherein generating the minimized excitation signal includes
    generating the minimized excitation signal having the extreme values using the number of frequency lines, frequency range of the SUT, and the minimum amplitude; and
    utilizing crest factor minimization to increase the extreme values of the minimized excitation signal toward a central value, without affecting the power spectrum of the minimized excitation signal.

16. The non-transitory computer readable media of claim 15, wherein the fifth set of instructions for generating the minimized excitation signal further includes a sixth set of instructions for shifting the input signal such that the minimized excitation signal uses a full signal range of a device under test ("DUT") in the SUT.

17. The non-transitory computer readable media of claim 16, wherein the fifth set of instructions for generating the minimized excitation signal further includes a seventh set of instructions for scaling the input signal such that the minimized excitation signal uses a full signal range of the DUT in the SUT.

18. The non-transitory computer readable media of claim 15, wherein the fifth set of instructions for generating the minimized excitation signal further includes a sixth set of instructions for scaling the input signal such that the minimized excitation signal uses a full signal range of a device under test ("DUT") in the SUT.

19. The non-transitory computer readable media of claim 18, wherein the sixth set of instructions for scaling utilizes a full signal range of an amplifier.

20. The non-transitory computer readable media of claim 15, wherein the fifth set of instructions for generating the minimized excitation signal further includes instructions for generating the input signal with a signal generator from which the minimized excitation signal is generated.

* * * * *

UNITED STATES PATENT AND TRADEMARK OFFICE
CERTIFICATE OF CORRECTION

PATENT NO. : 8,005,633 B2  Page 1 of 1
APPLICATION NO. : 11/347888
DATED : August 23, 2011
INVENTOR(S) : Lee Alton Barford et al.

It is certified that error appears in the above-identified patent and that said Letters Patent is hereby corrected as shown below:

Column 4, Line 44, "(SIN)" should read --(S/N)--.

Column 4, Line 52, "of the DVT" should read --of the DUT--.

Column 8, Line 45, "wherein the OUT" should read --wherein the DUT--.

Signed and Sealed this
Twentieth Day of December, 2011

David J. Kappos
*Director of the United States Patent and Trademark Office*